United States Patent
Fernald

(10) Patent No.: US 8,904,076 B2
(45) Date of Patent: Dec. 2, 2014

(54) CODER WITH SNOOP MODE

(75) Inventor: Kenneth W. Fernald, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 62 days.

(21) Appl. No.: 13/485,711

(22) Filed: May 31, 2012

(65) Prior Publication Data

US 2013/0321183 A1    Dec. 5, 2013

(51) Int. Cl.
*G06F 13/14*    (2006.01)
*G06F 13/36*    (2006.01)

(52) U.S. Cl.
USPC .......................................... 710/305; 710/306

(58) Field of Classification Search
None
See application file for complete search history.

(56) References Cited

U.S. PATENT DOCUMENTS

| 7,152,136 | B1 | 12/2006 | Charagulla |
| 7,231,558 | B2 | 6/2007 | Gentieu et al. |
| 7,782,325 | B2 | 8/2010 | Gonzalez et al. |
| 8,180,928 | B2 | 5/2012 | Elzur et al. |
| 2002/0162043 | A1* | 10/2002 | Messmer et al. ............... 713/500 |
| 2003/0191861 | A1 | 10/2003 | Greenblat |
| 2004/0088497 | A1* | 5/2004 | Deans et al. .................. 711/146 |

\* cited by examiner

*Primary Examiner* — Driss N Alrobaye
*Assistant Examiner* — David Martinez
(74) *Attorney, Agent, or Firm* — Meyertons, Hood, Kivlin, Kowert & Goetzel, P.C.

(57) ABSTRACT

Techniques are disclosed relating to coding data in an apparatus. In one embodiment, the apparatus includes a coder circuit coupled to a data bus, where the coder circuit is configured to receive an indication that data is being transmitted over the data bus from a first circuit to a second circuit. The coder circuit is configured to perform a coding operation on the data in response to receiving the indication. In some embodiments, the coder circuit is configured to operate in a mode in which the coder circuit captures data of a data transmission via the data bus without being specified as a participant of the data transmission. When the coder circuit is not operating in the mode, the coder circuit is not configured to capture data of a data transmission without being specified as a participant of the data transmission.

18 Claims, 4 Drawing Sheets

CODER WITH SNOOP MODE

BACKGROUND

1. Technical Field

This disclosure relates generally to integrated circuits, and more specifically, to circuits that include hardware for coding data.

2. Description of the Related Art

To reduce the load on a processor, designers may include one or more circuits that are configured to perform specialized operations that would normally be performed by executing software. In some instances, these circuits may facilitate performance of various types of encoding/decoding algorithms. For example, a processor may include one or more circuits for cryptographic operations (e.g., Advanced Encryption Standard (AES), error checksums (e.g., cyclic redundancy check (CRC)), etc.).

SUMMARY

The present disclosure describes embodiments of structures and methods relating to the coding of data.

In one embodiment, an apparatus is disclosed that includes a coder circuit coupled to a data bus. The coder circuit is configured to receive an indication that data is being transmitted over the data bus from a first circuit to a second circuit, where the coder circuit is distinct from the first circuit and the second circuit. The coder circuit is configured to perform a coding operation on the data in response to receiving the indication.

In another embodiment, an apparatus is disclosed that includes a bridge circuit coupled to a data bus. The bridge circuit is configured to select one of a plurality of circuits as a participant of a data transmission over the data bus, to indicate the selected circuit to a coder circuit. The coder circuit is configured to determine, based on the selected circuit, whether to retrieve data from the data transmission and code the data.

In yet another embodiment, a method is disclosed. The method includes an integrated circuit receiving an indication that data is being transmitted from a first circuit to second circuit via a data bus. The method further includes the integrated circuit determining whether to snoop the data from the data bus based on the indication. The method still further includes the integrated circuit performing a coding operation on the snooped data in response to the determining.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

DETAILED DESCRIPTION

In various embodiments, a system may include multiple circuits coupled along a data bus. To facilitate operation of these circuits, the system may initiate read and write operations to move data from one circuit to another. In one embodiment, the system includes a coder circuit coupled to the data bus such that the coder circuit is configured to operate in a snoop mode in which it captures data traffic from a data bus without being specified as a participant of a data transmission (i.e., specified as either the source providing the data of the data transmission or the destination receiving the data). By snooping data from data transmissions, the coder circuit, in many instances, can reduce the amount of data traffic over the data bus since additional data transmissions are not performed to separately transfer the data to the coder circuit for coding. In some embodiments, the coder circuit is also configured to begin encoding data (or decoding data, in some embodiments) upon snooping the data (as opposed to waiting for an explicit instruction to do so), thus allowing for a result to be produced more quickly.

Figure 1:
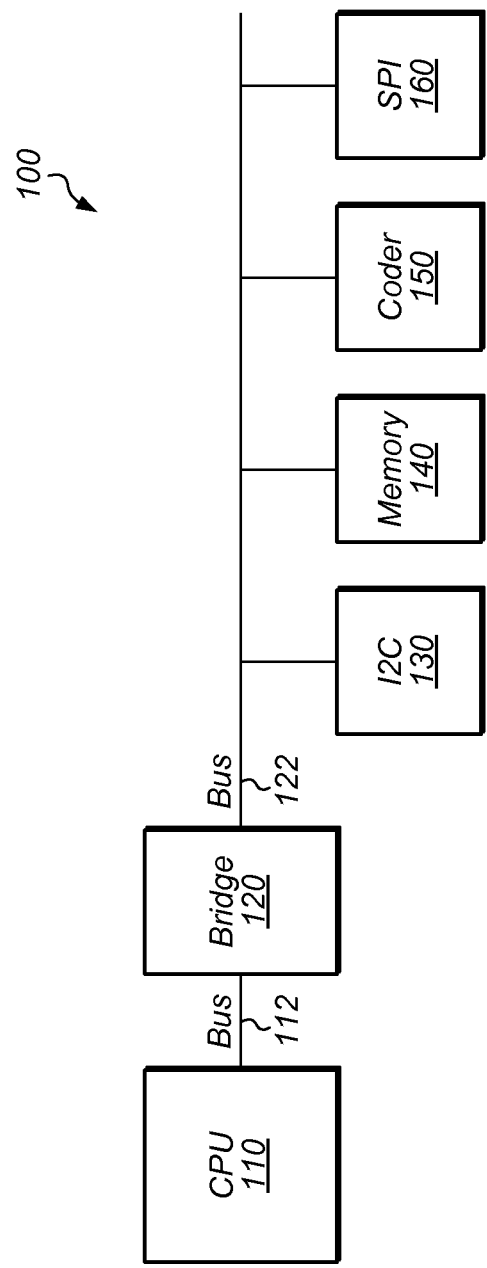
FIG. 1 is a block diagram illustrating one embodiment of a system that includes a coder circuit.

Turning now to FIG. 1, a block diagram of a system 100 is depicted. System 100 is one embodiment of a system that includes a coder circuit configured to snoop data from a bus. In the illustrated embodiment, system 100 includes a central processing unit (CPU) 110 coupled to a bridge circuit 120 via a data bus 112. System 100 further includes an inter-integrated circuit (I2C) 130, a memory 140, a coder circuit 150, and a serial peripheral interface (SPI) circuit 160, which are coupled to bridge circuit 120 via data bus 122. In some embodiments, system 100 may include a different set of circuits 130-160 than shown. In some embodiments, system 100 may be implemented as a system on a chip (SoC); in other embodiments, circuits 110-160 may be located on multiple separate integrated circuits.

CPU 110, in one embodiment, is configured to execute instructions (software and/or firmware) to facilitate operation of system 100. CPU 110 may be any suitable type of processor. Accordingly, CPU 110 may be a superscalar processor with a single or multiple pipelines, a microprocessor, a microcontroller, etc. CPU 110 may include a single or multiple cores each configured to execute instructions. CPU 110 may support any suitable instruction set architecture (ISA). For example, in one embodiment, CPU 110 is configured to support an Advanced RISC Machines (ARM) ISA. Although circuit 110 is shown as a CPU in the illustrated embodiment, in other embodiments, circuit 110 may be an arithmetic processing unit, a graphics processing unit (GPU), a digital signal processor (DSP), etc. In some embodiments, circuit 110 may also be an application-specific integrated circuit (ASIC), a field-programmable gate array (FPGA), etc.

Circuits 130-160 are representative of various circuits that may be accessible by CPU 110 to perform various operations. Although circuits 130-160 are shown in the illustrated embodiment as being coupled to bus 122, in other embodiments, various ones of circuits 130-160 (e.g. memory 140) may instead be coupled to bus 112. In some embodiments, system 100 may include a single bus (e.g., bus 112) or one or more buses in addition to those shown.

Bridge circuit 120, in one embodiment, is configured to convey traffic between buses 112 and 122. In some embodiments, bus 112 is a higher performance bus (e.g., having a higher clock frequency, greater bandwidth, etc.) than bus 122. In one embodiment, bus 112 may be configured to implement an advanced high-performance bus (AHB), and bus 122 may be configured to implement an advanced peripheral bus (APB); bridge circuit 120 may thus correspond to an AHB2APD bridge (although bridge circuit 120 and buses 112/122 may implement any suitable bus architecture). As will be described below, in various embodiments, bridge circuit 120 may be configured to coordinate write operations and read operations with circuits 130-160 as well as to assist coder circuit 150 in snooping bus 122. Although particular operations are described below as being performed by bridge circuit 120, these operations may be performed by circuits other than a bridge circuit, such as CPU 110, a direct memory access (DMA) controller for bus 112/122, another type of bus master, etc.

I2C 130, in one embodiment, is configured to facilitate communication between system 100 and one or more I2C compatible devices. As discussed above, I2C 130 is representative of a circuit that may produce data for or access data from various ones of circuits 110-160.

Memory 140, in one embodiment, is configured to store data accessible by ones of circuits 110-160. Accordingly, memory 140 may store instructions of software/firmware executable by CPU 110. Memory 140 may be any suitable type of memory, such as flash memory, random access memory (RAM—static RAM (SRAM), extended data out (EDO) RAM, synchronous dynamic RAM (SDRAM), double data rate (DDR) SDRAM, RAMBUS RAM, etc.), read-only memory (ROM—programmable ROM (PROM), electrically erasable programmable ROM (EEPROM), etc.), and so on.

Coder circuit 150, in one embodiment, is configured to perform a coding operation on data on bus 122. In one embodiment, the coding operation is a hashing operation such as performed in MD1-MD6, SHA0-SHA3, etc. In one embodiment, the coding operation is an encryption or decryption operation such as performed in the Data Encryption Standard (DES), Advanced Encryption Standard (AES), Rivest Shamir Adleman (RSA), Digital Signature Algorithm (DSA), etc. In one embodiment, the coding operation produces a checksum value such as Hamming codes, Reed-Muller codes, cyclic redundancy check (CRC) codes, etc. Examples of CRC algorithms that may be supported by coder circuit 150 include CRC32 (which uses the polynomial 0x04C11DB7 and may be employed by IEEE 802.3), CRC16a (which uses the polynomial 0x1021 and may be employed CCITT-16), CRC16b (which uses the polynomial 0x3D65 and may be employed by IEC16-M-Bus), CRC16c (which uses the polynomial 9x8005 and may be employed by ZigBee, IEEE 802.15.4, USB), etc. In some embodiments, the coding operation may be a mathematical operation such as fast Fourier transforms (FFT), modular arithmetic operations (e.g., including Montgomery reductions), etc. However, setting a flag as part of a cache coherency protocol (e.g., to indicate that a particular cache line is no longer valid) in response to detecting data on bus 122 does not constitute performing a coding operation on the detected data.

SPI circuit 160 is one embodiment of a circuit that is configured to generate outbound data frames (i.e., data packets) and process inbound data frames for system 100. In other embodiments, circuit 160 may be configured to support physical layer protocols other than SPI such as Controller-area network (CAN), Infrared Data Association (IrDA), USB (Universal Serial Bus), IEEE 1394, IEEE 802.11, 2-wire serial communication (see DALLAS SEMICONDUCTOR), I2C, etc. In various embodiments, SPI circuit 160 generates data frames that include data coded by coder circuit 150 and processes data frames with coded data that may be processed by coder circuit 150. For example, in one embodiment, SPI circuit 160 may generate a data frame that includes a data payload and CRC value (i.e., code) generated by coder circuit 150 from the data payload. SPI circuit 160 may also use coder circuit 150 to verify a CRC value of a received data frame. In one embodiment, SPI circuit 160 may send or receive a data frame with an encrypted payload that is encrypted or decrypted by coder circuit 150.

In the illustrated embodiment, circuits 130-160 receive and send data as write and read operations that are coordinated by bridge circuit 120. In some embodiments, these operations may be initiated by a bus master on bus 112 such as CPU 110, a DMA controller (not shown), etc. As will be described in further detail with respect to FIG. 2, in various embodiments, bridge circuit 120 may coordinate a write operation or a read operation by specifying the participant of an operation (e.g., via a selection signal), an address (or address range) associated with the operation, an amount of data being transferred (i.e., transfer width), and/or whether the operation is a write operation or read operation. For example, in one embodiment, coder circuit 150 may be mapped as a peripheral on bus 122. When a write operation is performed to coder circuit 150, bridge circuit 120 may identify coder circuit 150 as a participant of the write operation and may specify an address of a register in coder circuit 150 configured to store data. Once the data has been coded, in one embodiment, bridge circuit 120 may coordinate a read operation of the data by again identifying coder circuit 150 as a participant and specifying an address of the register storing the result. Read and write operations may be performed in a similar manner for other ones of circuits 130-160.

As noted above, coder circuit 150, in various embodiments, is further configured to operate in a mode in which it monitors and captures data traffic (i.e., snoops) from bus 122 without being specified as a participant of a data transmission by bridge circuit 120. As will be described in further detail below with respect to FIG. 3, coder circuit 150 may be configured to snoop and code data based on various criteria such as for all read operations, write operations, or both, operations associated with a particular peripheral or a particular bus address, etc. For example, in one embodiment, coder circuit 150 may be configured to code data being transmitted by SPI circuit 160. Coder circuit 150 may monitor bus 122 for all write operations to SPI circuit 160. Upon identifying such operation, coder circuit 150 may capture and code the data. After the result becomes available, the result may be moved from coder circuit 150 to SPI circuit 160 for transmission within a data frame.

By snooping data, coder circuit 150 is able to reduce the number of transmissions over bus 122 as additional write operations are not performed to separately provide the data to coder circuit 150. Since these additional operations may result in higher power consumption and additional delays as the data is moved twice across bus, snooping data may improve overall performance of system 100.

Figure 2:
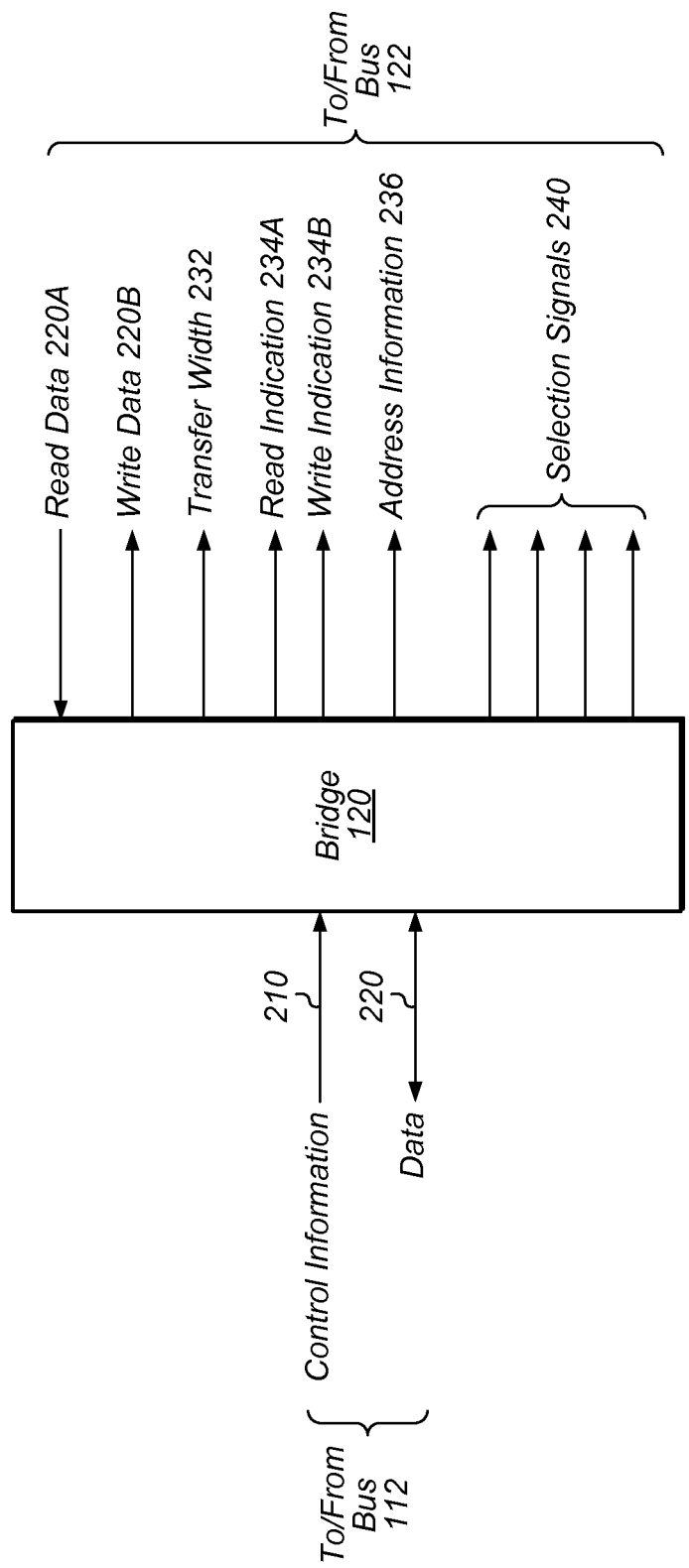
FIG. 2 is a block diagram illustrating one embodiment of a bridge circuit within the system.

Turning now to FIG. 2, one embodiment of bridge circuit 120 is depicted. As discussed above, in various embodiments, bridge circuit 120 is configured to convey traffic between buses 112 and 122. In the illustrated embodiment, bridge circuit 120 is configured to exchange control information 210 and data 220 via bus 112, and to exchange read data 220A, write data 220B, transfer widths 232, read and write indications 234, address information 236, and selection signals 240 via bus 122. In some embodiments, bridge circuit 120 may be configured to send and/or receive more (or less) signals than shown.

In one embodiment, bridge circuit 120 is configured to operate as a slave device on bus 112, where circuit 120 receives control information 210 from a bus master (such as CPU 110, a DMA controller, etc.). In the illustrated embodiment, control information 210 is information that is usable by bridge circuit 120 to perform a read operation or a write operation via bus 122. In various embodiments, information 210 may include or be usable by bridge circuit 210 to generate various ones signals 232-240.

In the illustrated embodiment, bridge circuit 120 is configured to convey data 220 simultaneously via separate bus channels as read data 220A and write data 220B (in other embodiments, bus 122 may include bidirectional bus channels). In some embodiments, bridge circuit 120 may be configured to convey data 220 in bursts of variable widths. For example, in one embodiment, data 220 may be sent as either byte, two-byte, or four-byte bursts. Transfer width 232, in one embodiment, is the size of these bursts. Accordingly, circuits 130-160 may use transfer width 232 to determine the amount of data to read from bus 122.

Indications 234A and 234B, in one embodiment, specify whether a particular operation is a read operation or a write operation. In the illustrated embodiment, indications 234A and 234B are shown as separate signals; in another embodiment, indications 234 may be a single signal (e.g., that is a logical one for a write operation and a logical zero for a read operation, or vice versa).

Address information 236, in one embodiment, specifies the addresses (i.e., locations) at which data 220 is to be written to or to be read from. Accordingly, circuits 130-160 may use address information 236 to identify particular registers and/or memory within circuits 130-160. Such circuits may be byte addressable, word addressable, etc.

Selection signals 240, in one embodiment, identify the particular circuit (or circuits) participating in data transmission over bus 122. In one embodiment, bridge circuit 120 may be configured to provide a respective signal 240 to each one of circuits 130-160. Bridge circuit 120 may assert a respective signal 240 (by setting (or clearing) the value of the signal 240) of a circuit 130-160 if that circuit is responsible for sending or receiving data 220.

In various embodiments, coder circuit 150 may be configured to use various ones of signals 232-240 to determine whether to capture data from bus 122 during snoop mode.

Figure 3:
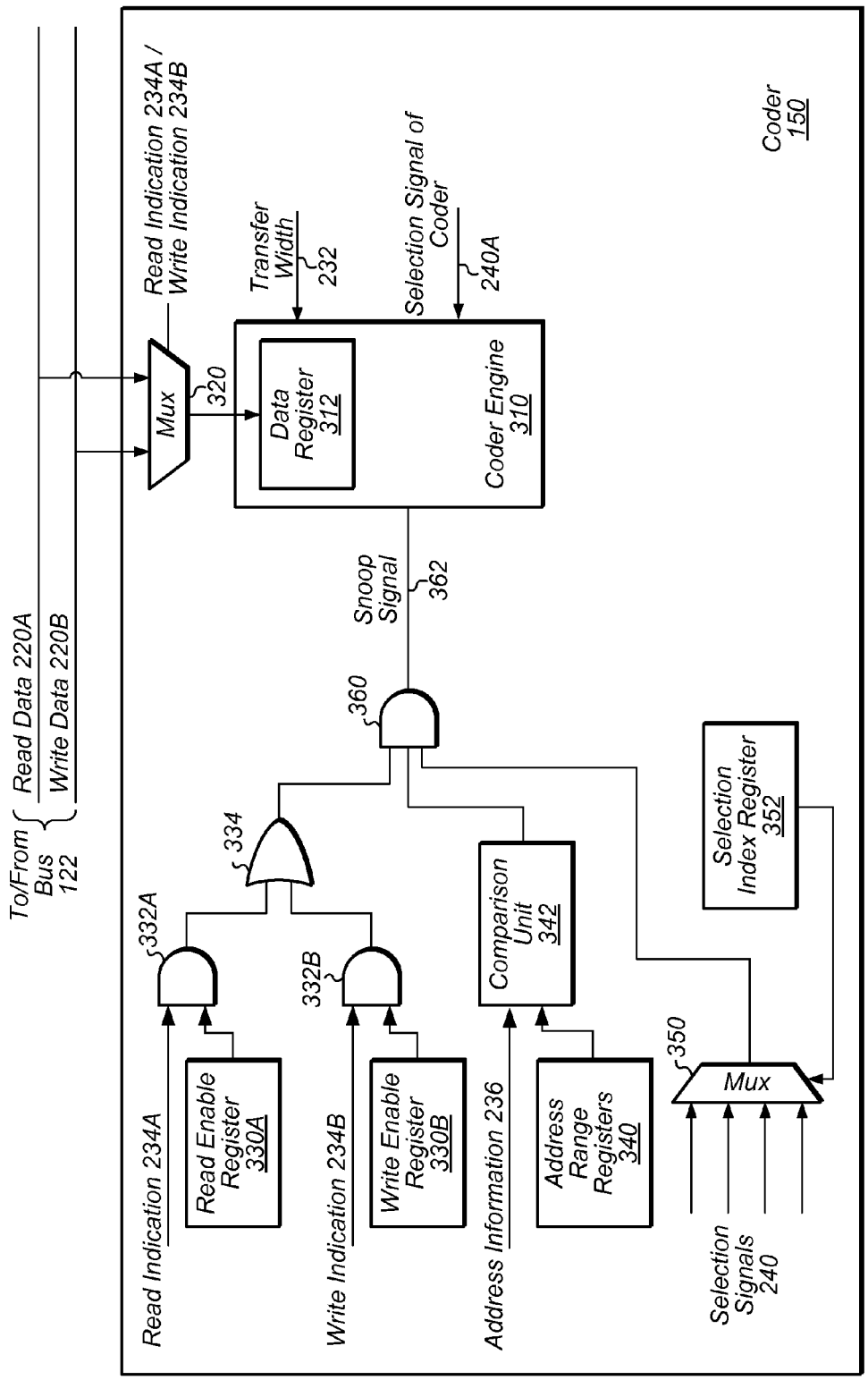
FIG. 3 is a block diagram illustrating one embodiment of the coder circuit.

Turning now to FIG. 3, one embodiment of coder circuit 150 is depicted. In the illustrated embodiment, coder circuit 150 includes a coder engine 310; multiplexers (Mux) 320 and 350; registers 330A, 330B, 340, and 352; AND gates 332A, 332B, and 360; and OR gate 334. In some embodiments, coder circuit 150 may use different combinatorial logic than shown.

Coder engine 310, in one embodiment, is circuitry configured to implement the coding algorithm supported by coder circuit 150. Coding engine 310 may be configured to perform any of the coding operations described above. In the illustrated embodiment, engine 310 operates on data 220 routed through Mux 320 and stored in register 312. In one embodiment, engine 310 captures data 220 in response to either the selection signal 240A for coder circuit 150 (which may be one of the selection signals 240 asserted by bridge circuit 120 specifically when circuit 150 is specified as the participant of a write operation or read operation) or snoop signal 362 (discussed below). In the illustrated embodiment, engine 310 determines the amount of data 220 to capture (and thus the amount of data 220 to operate upon) based on transfer width 232. In various embodiments, engine 310 may store one or more additional values used to perform the coding operation such as seed values, CRC polynomials, encryption keys, etc. In some embodiments, these values may be stored in one or more accessible registers (not shown), which may be programmable via write operations. Once engine 310 has completed coding a set of data 220, engine 310 stores the result, in the illustrated embodiment, back into register 310, which can then be accessed during a read operation (in other embodiments, engine 310 may use a separate register for storing results). In one embodiment, engine 310 is configured to produce a result within one clock cycle, thus allowing for a result to be read on the cycle after a snoop is performed.

Snoop signal 362 may be asserted based on any of various criteria. For example, in the illustrated embodiment, snoop signal 362 is asserted based on the type of operation being performed (whether an operation is a write or read operation), address information associated with the operation, and the particular circuit identified as participating in the operation. In other embodiments, more or less criteria may be used.

In the illustrated embodiment, circuits 330-334 are configured to determine whether snoop signal 362 should be asserted based on the type of operation being performed. In one embodiment, a value may be written during a write operation to one or both of registers 330A and 330B to enable snooping for read operations, write operations, or both. For example, a logical one may be written to register 330A to enable snooping on read operations. Accordingly, in such an embodiment, if snooping is not enabled for either operation, coder circuit 150 is not operating in snoop mode, and thus, does not perform snooping. As shown, the outputs of registers 330A and 330B are provided along with read indication 234A and 234B to AND gates 332A and 332B, respectively. The outputs of AND gates 332 are then provided to an OR gate 334, which, in turn provides its result to AND gate 360.

In the illustrated embodiment, circuits 340 and 342 are configured to determine whether snoop signal 362 should be asserted based on the address information 236 of an operation. In one embodiment, registers 340 are configured to store programmable upper and lower bounds for one or more respective address ranges. In one embodiment, comparison circuit is configured to determine whether an address specified in address information 236 falls within one of these ranges. If the specified address falls within a particular range, comparison circuit 342 may assert its output provided to AND gate 360.

In the illustrated embodiment, circuits 350 and 352 are configured to determine whether snoop signal 362 should be asserted based on the particular circuit that is participating in the operation. In one embodiment, register 352 is configured to store a value indicative of the particular circuit for which traffic is being snooped (e.g., a value identifying circuit 160). In the illustrated embodiment, register 352 provides this value as a selection index to Mux 350. Mux 350, in turn, uses the value to route the selection value 240 for that circuit to AND gate 360.

In the illustrated embodiment, if all input signals for AND gate 360 are asserted indicating that all criteria have been satisfied, AND gate 360 asserts signal 362 causing coder engine 310 to capture data 220 from bus 122.

Figure 4:
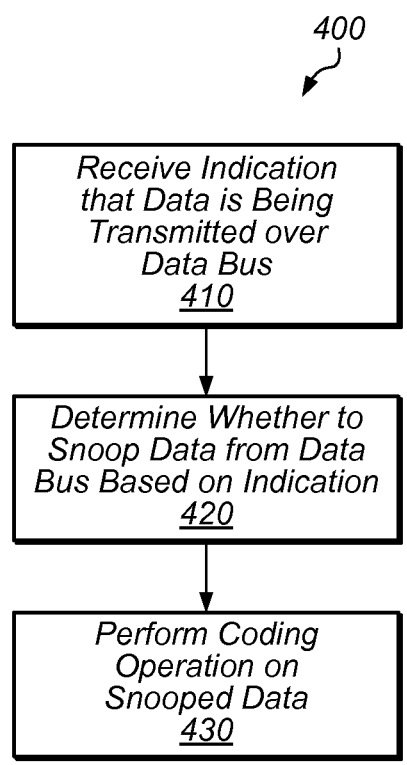
FIG. 4 is a flow diagram illustrating one embodiment of a method that may be performed by the coder circuit.

Turning now to FIG. 4, a flow diagram of a method 400 is depicted. Method 400 is one embodiment of method that may be performed by a coder circuit (or a system that includes a coder circuit) such as coder circuit 150 described above. In some instances, performance of method 400 may reduce the amount of data traffic over a data bus coupled to the coder circuit. In some embodiments, performance of method 400 may allow a coded result to be available more quickly for subsequent use.

In 410, a coder circuit receives an indication (e.g., one or more of signals 232-240) that data is being transmitted from a first circuit (e.g., any one of circuits 110-160) to a second circuit (e.g., another one of circuits 110-160) via a data bus. As discussed above, in various embodiments, the indication may specify characteristics about the transmission such as one or both of the participants in the data transmission, the type of operation associated with the transmission, address information, the size of data, etc. In one embodiment, this information may be provided to coder circuit by a bridge circuit coupled to the data bus (e.g., bridge circuit 120).

In 420, the coder circuit determines whether to snoop the data from the data bus based on the indication. This determination may be based on any of the various criteria described above.

In 430, the coder circuit performs a coding operation on the snooped data. The coding operation may include any of the coding operations described above. In one embodiment, the coder circuit may read the data being coded from the data bus into a register (e.g., register 312), and replace the data in the register with a result of the coding operation. In some embodiments, the coded result may be included within a data frame for transmission (e.g., by SPI circuit 160) to another apparatus (e.g., external to system 100).

Although specific embodiments have been described above, these embodiments are not intended to limit the scope of the present disclosure, even if a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
    a bridge circuit configured to facilitate communication from a first data bus to a second data bus, wherein the bridge circuit is configured to provide an indication that data is being transmitted over the second data bus from a first circuit to a second circuit;
    a coder circuit coupled to the second data bus, wherein the coder circuit is configured to receive the indication from the bridge circuit, wherein the coder circuit is distinct from the first circuit and the second circuit; and
    wherein the coder circuit is configured to perform a coding operation on the data in response to receiving the indication.

2. The apparatus of claim 1, wherein the bridge circuit is configured to identify the first circuit or the second circuit as a participant of a data transmission of the data; and
    wherein the coder circuit is configured to determine, based on the identified circuit, whether to perform the coding operation on the data.

3. The apparatus of claim 1, wherein the coder circuit is configured to operate in a mode in which the coder circuit captures data of a data transmission via the second data bus without being specified as a participant of the data transmission, and wherein, when the coder circuit is not operating in the mode, the coder circuit is configured to not capture data of a data transmission without being specified as a participant of the data transmission.

4. The apparatus of claim 1, wherein the indication specifies whether the data is associated with a write operation or a read operation, and wherein the coder circuit is configured to determine whether to capture the data from the second data bus based on whether the data is associated with a write operation or is associated with a read operation.

5. The apparatus of claim 1, wherein the coding operation produces a cyclic redundancy check (CRC) value from the data.

6. The apparatus of claim 5, wherein the first circuit or the second circuit is a serial peripheral interface (SPI) circuit configured to transmit a data frame including the data and the CRC value.

7. The apparatus of claim 1, wherein the coder circuit is configured to:
    read the data from the second data bus into a register of the coder circuit; and
    replace the data in the register with a result of the coding operation.

8. A method, comprising:
    receiving, at a coder circuit, an indication that data is being transmitted from a first circuit to second circuit via a first data bus, wherein the indication is provided by a bridge circuit configured to receive data transmissions from a second data bus and covey the data transmissions across the first data bus;
    determining, by the coder circuit, whether to snoop the data from the first data bus based on the indication; and
    performing, by the coder circuit, a coding operation on the snooped data in response to the determining.

9. The method of claim 8, wherein the coding operation includes generating a cyclic redundancy check (CRC) value from the snooped data.

10. The method of claim 8, further comprising:
    the coder circuit receiving an instruction to operate in a mode in which the coder circuit captures data of a data transmission via the first data bus without being specified as a destination of the data transmission, and wherein, when the coder circuit is instructed to not operate in the mode, the coder circuit is not configured to capture data of a data transmission without being specified as a destination of the data transmission.

11. The method of claim 8, further comprising:
    the coder circuit receiving an indication specifying whether the data is associated with a write operation or a read operation; and
    the coder circuit determining to snoop the data based on whether the data is specified as being associated with a write operation or is specified as being associated with a read operation.

12. The method of claim 8, wherein the first data bus is an advanced peripheral bus (APB).

13. A method, comprising:
    a coder circuit receiving, from a bridge circuit, an indication that data is being transmitted over a data bus from a first circuit to a second circuit, wherein the coder circuit is distinct from the first circuit and the second circuit, and wherein the bridge circuit is configured to enable a circuit to communicate a transmission across two buses; and
    the coder circuit performing a coding operation on the data in response to receiving the indication.

14. The method of claim 13, further comprising:
    the bridge circuit identifying the first circuit or the second circuit as a participant of a data transmission of the data, wherein the coder circuit is configured to determine, based on the identified circuit, whether to perform the coding operation on the data.

15. The method of claim 14, further comprising:
the coder circuit operating in a mode in which the coder circuit captures data of a data transmission via the data bus without being specified as a participant of the data transmission, wherein, when the coder circuit is not operating in the mode, the coder circuit is configured to not capture data of a data transmission without being specified as a participant of the data transmission.

16. The method of claim 14, wherein the indication specifies whether the data is associated with a write operation or a read operation; and
wherein the method further comprises:
the coder circuit determining whether to capture the data from the data bus based on whether the data is associated with a write operation or is associated with a read operation.

17. The method of claim 14, wherein the first circuit or the second circuit is a serial peripheral interface (SPI) circuit configured to transmit a data frame including the data and the CRC value.

18. The method of claim 14, further comprising:
the coder circuit reading the data from the data bus into a register of the coder circuit; and
the coder circuit replacing the data in the register with a result of the coding operation.

* * * * *